United States Patent [19]

Agrawal et al.

[11] Patent Number: 5,606,567

[45] Date of Patent: Feb. 25, 1997

[54] DELAY TESTING OF HIGH-PERFORMANCE DIGITAL COMPONENTS BY A SLOW-SPEED TESTER

[75] Inventors: Vishwani D. Agrawal, New Providence; Tapan J. Chakraborty, Mercerville, both of N.J.

[73] Assignee: Lucent Technologies Inc., Murray Hill, N.J.

[21] Appl. No.: 327,338

[22] Filed: Oct. 21, 1994

[51] Int. Cl.$^6$ .................................................. G06F 11/00
[52] U.S. Cl. ...................... 371/22.4; 371/22.1; 371/25.1; 368/113
[58] Field of Search ..................................... 368/113, 118, 368/120; 365/189.05, 201; 235/302; 371/25, 23, 24, 22.4, 25.1, 22.1; 324/73 R

[56] References Cited

U.S. PATENT DOCUMENTS

| | | | |
|---|---|---|---|
| 4,063,080 | 12/1977 | Eichelberger et al. | 235/302 |
| 4,477,902 | 10/1984 | Puri et al. | 371/25 |
| 4,641,306 | 2/1987 | Annecke et al. | 371/25 |
| 5,181,191 | 1/1993 | Farwell | 368/113 |
| 5,351,211 | 9/1994 | Higeta et al. | 365/189.05 |
| 5,365,528 | 11/1994 | Agrawal et al. | 371/25.1 |

OTHER PUBLICATIONS

Agrawal, V. D., and Seth, S. C., *Test Generation for VLSI Chips*, Chapter VII: Automatic Test Application, IEEE Computer Society Press, May 3, 1988, pp. 327–331.

Agrawal, V. D., et al., "Built–in Self–test for Digital Integrated Circuits," New Electronic Test Technologies, AT&T Technical Journal, vol. 73, No. 2, Mar./Apr. 1994, pp. 30–39.

*Primary Examiner*—Robert W. Beausoliel, Jr.
*Assistant Examiner*—Nadeem Iqbal

[57] ABSTRACT

High speed testing of a digital circuit may be performed although the rated frequency of the circuit exceeds the frequency capability of the test equipment. A digital circuit may be designed such that a controllable delay may be introduced in the timing paths of the circuit during testing using test stimuli which are applied at a clock rate that is less than the rated frequency of the circuit. By adding delay to the combinational signal path, testing of the circuit for operation at the maximum operating frequency is achieved during testing at a clock rate which is within the capability of the test equipment. The controllable delay may be incorporated as a delay element into a single-clock circuit and controlled by manipulation of the duty-cycle of a clock waveform which is applied to the circuit. The delay circuit is so designed that its function is also testable. In a multiclock circuit, the delay is added to the circuit by skewing one clock signal with respect to the other clock signals.

23 Claims, 9 Drawing Sheets

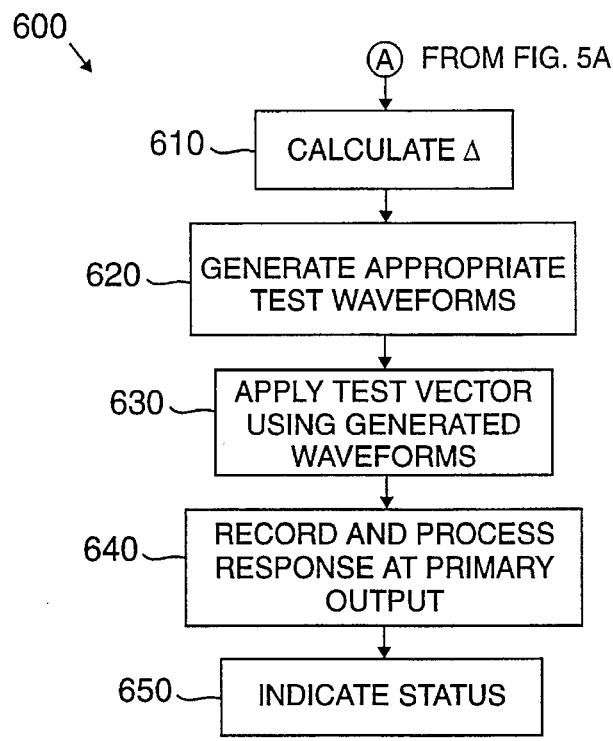
FIG. 5B
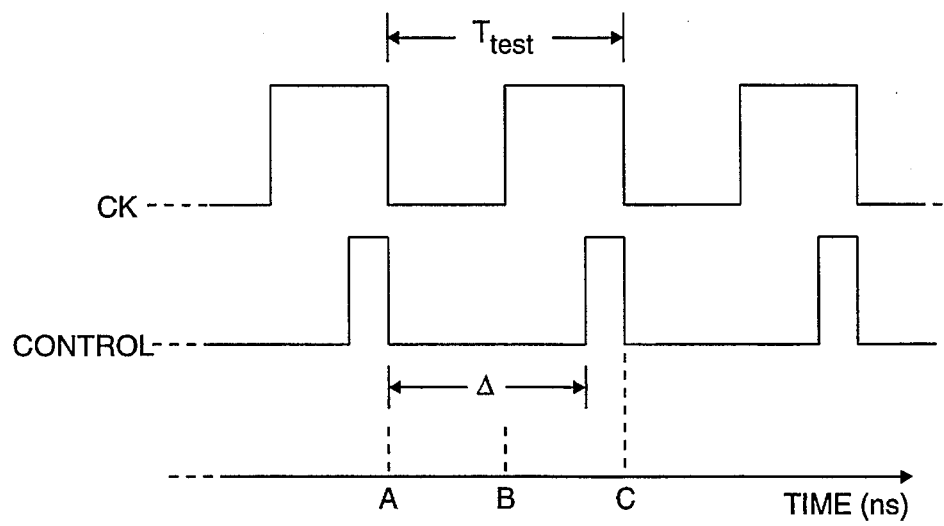
FIG. 6A
FIG. 6B

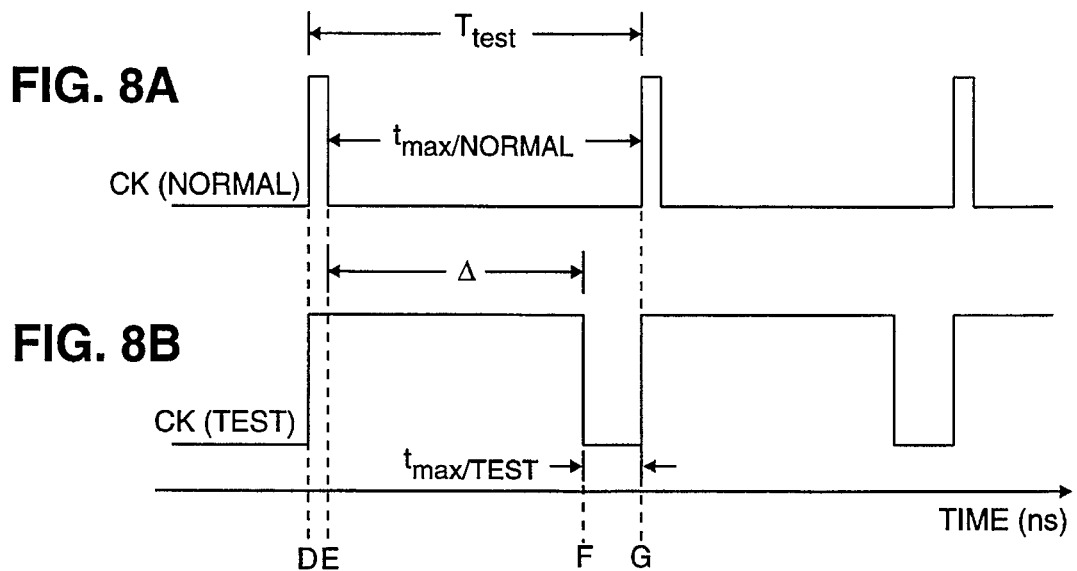
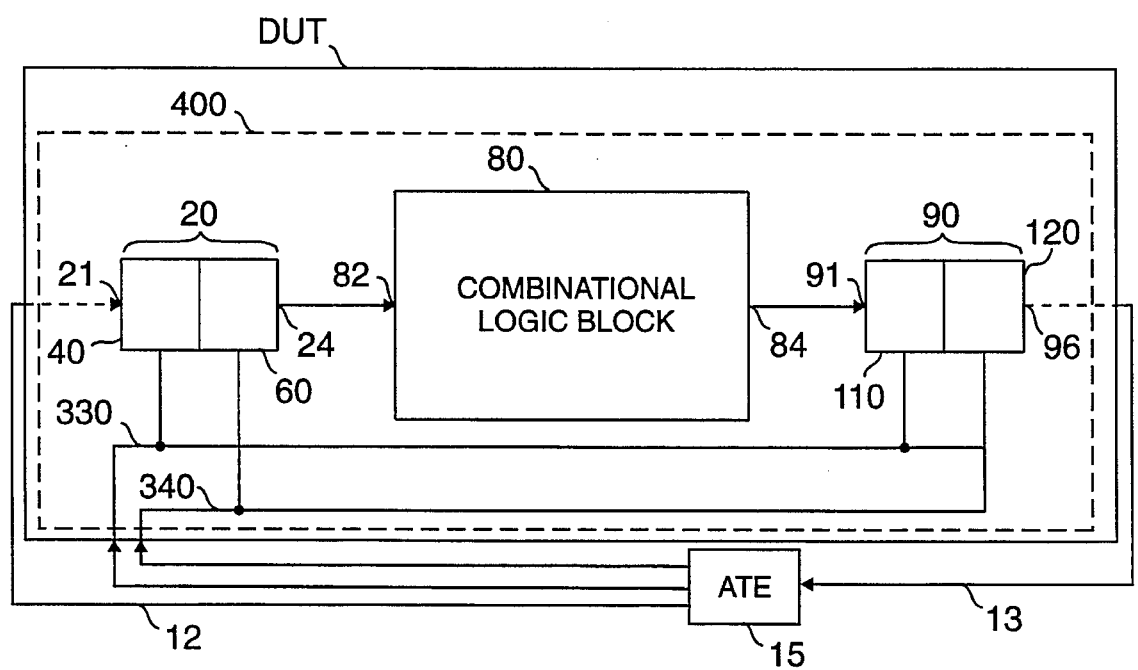

TIME (ns)

DELAY TESTING OF HIGH-PERFORMANCE DIGITAL COMPONENTS BY A SLOW-SPEED TESTER

FIELD OF THE INVENTION

This invention relates generally to digital component testing. More particularly, the present invention relates to the testing of a high speed digital component at a clock rate that is less than the rated frequency of the component.

BACKGROUND

Digital components, such as VLSI chips, printed circuit boards and multi-chip modules, are being designed to operate at frequencies exceeding 100 MHz. Typical automatic test equipment (ATE) used for testing digital components in a high-volume production environment currently can perform testing at clock rates only approaching 40 MHz. Testing at lower than the rated frequency or clock rate, however, cannot guarantee proper operation of a digital component at the rated frequency.

A need exists for a method and apparatus for testing complex and high speed digital components at a clock rate that is less than the rated frequency that can guarantee operation at the rated frequency. The rated speed of the most technologically advanced components will, in most circumstances, exceed the capability of the available ATEs, and act as the motivating factor in the development of higher speed ATEs.

ATE designs capable of testing at clock rates around 500 MHz have been shown feasible for further development for a production environment. It is known, however, that the cost of an ATE increases significantly as a function of testing speed, pin count and vector memory required for testing a component. Therefore, the cost of an ATE capable of testing a complex high speed digital component, such as a VLSI, which often has a high pin-count and requires long vector sequences for testing, at the rated frequency would be extremely high. Further, ATE testing performed at frequencies that exceed 20 MHz is influenced by test system noise, which is a source of inaccuracy in the testing.

Built-in self-test (BIST), as described in V. D. Agrawal, C.-J. Lin, P. W. Rutkowski, S. Wu, and Y. Zorian, "Built In Self-Test for Digital Integrated Circuits," AT&T Tech. Jour., Vol. 73, pp. 30–39, March/April 1994, and incorporated by reference herein, is often cited as a solution to the high-speed testing problem. In this method, hardware is added to the digital component for test data generation and response analysis. For instance, a high-speed clock may be supplied from an external ATE while the hardware inside the device under test generates test patterns. Thus, the ATE would not require a large vector memory and a high pin-count capability. The BIST method, however, may not provide an adequate diagnostic or debug capability because the entire test response is compacted into a simple go/no-go signature again by the added response analysis circuitry. In addition, BIST adds substantial and costly hardware to the device. Also, for some high speed components, the extra circuit required for performing BIST cannot be added because it would degrade the high speed of operation of the component.

SUMMARY OF THE INVENTION

The present invention provides a method for testing a combinational logic block of a high speed digital circuit for operation at the rated frequency, using test stimuli applied at a test clock rate that is less than the rated frequency. During ATE testing at the slower test clock rate, a select amount of delay, which is calculated based on the test clock rate and the rated frequency of the circuit, is added to the combinational signal path of the circuit which includes the combinational logic block. The delay is added to the signal path in a manner that reduces the amount of time that a test stimulus which is applied at the slower test clock rate must propagate through the combinational logic block during ATE testing. As a result, testing of the combinational logic block at the rated frequency is simulated because the addition of the delay to the signal path requires that the test stimulus propagate through the combinational logic block at the rated frequency for a proper circuit response to be obtained during ATE testing.

In one embodiment, a single-clock synchronous digital circuit is modified during fabrication to include a controllable delay element in order that a calculated amount of delay may be added to the combinational signal path during ATE testing. The controllable delay element may be a static element, such as one formed by combinational logic gates, or a dynamic element, such as a pulse-triggered transistor switch. The amount of delay that is added by the controllable delay element to the combinational signal path is controlled by varying the duty cycle of a test signal waveform which the ATE generates for testing the timing operation of the combinational logic block in the signal path. Complete testing of this circuit requires that the ATE generate another signal waveform to test the logical operations of the controllable delay element.

In another embodiment, a calculated amount of delay may be added to a combinational signal path in a multi-clock synchronous digital circuit in order to simulate testing of a combinational logic block in the signal path at the rated frequency by introducing a phase variation to one of a plurality of slow test clock signals which are used for controlling the propagation of test stimuli through the circuit.

Other features and advantages of the present invention will be readily apparent from the detailed description that follows.

DESCRIPTION OF THE DRAWINGS

FIG. 5B is a flow diagram of a method for testing the combinational logic element in the circuit of FIG. 4A at the slower test clock rate.

FIGS. 6A and 6B illustrate clock waveforms, respectively, which may be used for applying an input signal sequence to the circuit in FIG. 4A, and a control signal waveform which may be used for manipulating the controllable delay element in the circuit in FIG. 4A.

FIGS. 8A and 8B illustrate a normal and a test clock waveform, respectively, that may be used for controlling the dynamic controllable delay element of FIG. 7B during testing of the circuit of FIG. 7A at the test clock rate.

FIG. 9 illustrates a combinational signal path in a two-clock synchronous high speed digital circuit.

DETAILED DESCRIPTION

Testing for faults in the internal logic of a high speed digital circuit or component requires that the combinational logic elements or flip-flops in the circuit be tested at the rated frequency of the circuit. An automatic test equipment (ATE) apparatus tests the high speed operation of a circuit by applying test vectors and clocking signals to the primary inputs of a circuit in accordance with well known test methodologies, such as the techniques described in V. D. Agrawal and S. C. Seth, Test Generation for VLSI Chips, IEEE Computer Society Press, Los Alamitos, Calif. (1988), pp 327–331, which is incorporated by reference herein. The ATE then compares the signal response that appears at a primary output of the circuit to an expected correct response which is simulated based on the design of the circuit under test. Any mismatch between the monitored and expected response indicates the presence of one or more faults, such as, for example, a single stuck-at fault or a path delay fault, in the combinational logic or flip-flop elements of the circuit. In particular, if a delay fault exists in the combinational signal path of a circuit, the time of propagation through the circuit increases to a value that is greater than the rated clock period, such that operation of the circuit at the rated clock frequency cannot occur.

This invention provides a technique for testing for the presence of a delay fault in a combinational logic block, in other words, testing the timing operation of the combinational block, which is included in a combinational signal path of a high speed digital circuit, using test stimuli applied at a test clock rate that is less than or slower than the rated frequency of the circuit. A test clock rate is referred to as slow when the test clock rate capability of the testing equipment is less than the rated frequency of the circuit. For purposes of this description, a combinational logic block is representative of a circuit which may comprise any number of combinational logic gates and flip-flop elements which are suitably connected to produce a desired result. As explained in further detail below, the addition of a delay to the signal path enables the ATE to test the combinational logic block for operation at the rated frequency using test stimuli which are applied at a slow test clock rate. Although the invention is explained below with respect to the ATE testing of exemplary circuits having a combinational logic block located between two clocked elements, it is to be understood that the circuits described below are typically embedded in larger digital circuits, and that the technique of this invention may be applied for testing all types of timing paths, such as, for example, those that begin at flip-flops or the primary inputs of a circuit.

Figure 1:
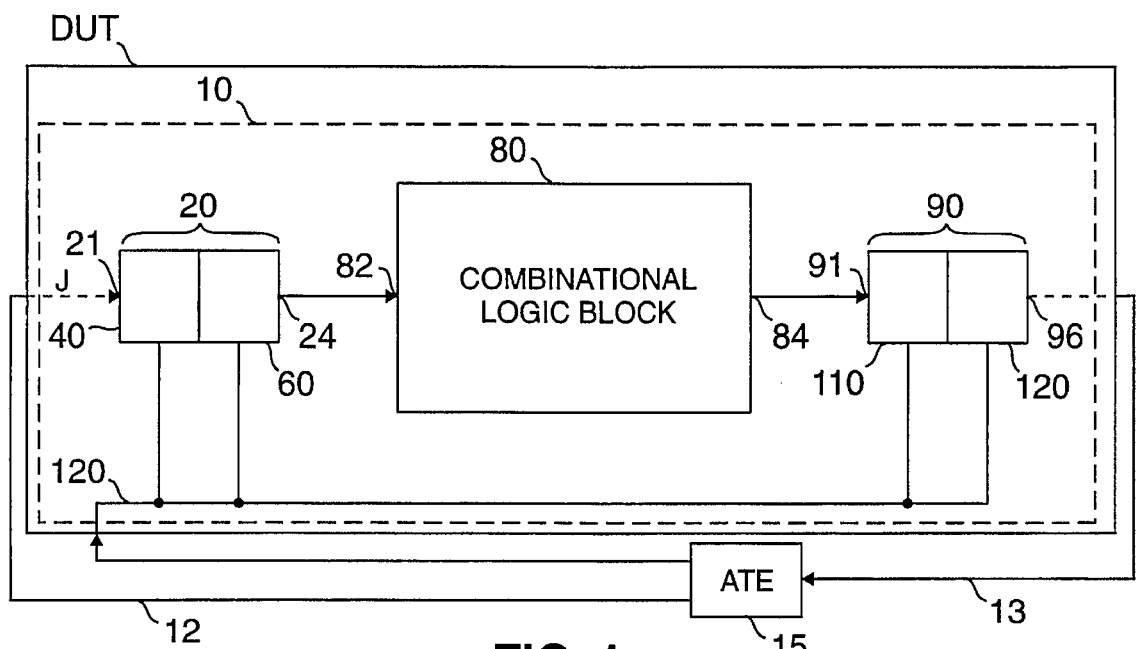
FIG. 1 illustrates a combinational signal path in a single-clock synchronous high speed digital circuit including a combinational logic block.

FIG. 1 shows the prior art and is included to provide a better understanding of how a single-clock synchronous high speed digital circuit 10 in a high speed component, called a device under test (DUT), may be modified such that a delay may be added to the signal path during testing by an automatic test equipment (ATE) device 15. The technique of adding delay to the signal path of a circuit during testing for simulating the testing of the internal logic of a circuit in a DUT at the rated frequency using a slower test clock rate is explained, by way of illustration, with respect to the modifications that may be made to the circuit 10. It is to be understood that the circuit 10 is exemplary, and that the method of this invention, as described below, may be applied for testing a combinational logic block in other types of single clock circuits.

The circuit 10 is comprised of a combinational logic block 80 which is connected between a first two-latch element 20 and a second two-latch element 90, which are thereby connected through the combinational logic block 80. The elements 20 and 90 are exemplary of logic circuitry which is used for synchronizing the propagation of signals through the internal logic of a circuit, which is shown in the circuit 10 as the combinational logic block 80. The two-latch elements 20 and 90 are typically implemented as master and slave flip-flops, and are described as such hereinafter. The two-latch element 20 includes a master input 21 and a slave output 24. Similarly, the two-latch element 90 includes a master input 91 and a slave output 96. The slave output 24 is connected to an input 82 of the combinational logic block 80. The master input 91 is connected to an output 84 of the combinational logic block 80.

A clock line 120 is connected from the ATE 15 to a primary input of the DUT which is connected directly to the two-latch elements 20 and 90, as described in greater detail below. An input line 12 and an output line 13 are connected from the ATE 15 to a primary input and a primary output of the DUT, respectively. The primary input is directly or indirectly connected to the master input 21, and the primary output is directly or indirectly connected to the slave output 96. It is to be understood that the input line 12 may include a plurality of primary inputs of the DUT, and the output line 13 may include a plurality of primary outputs of the DUT. For purposes of clarity, the invention is explained below with reference to a DUT having only one primary input and one primary output on the lines 12 and 13, respectively.

Figure 2:
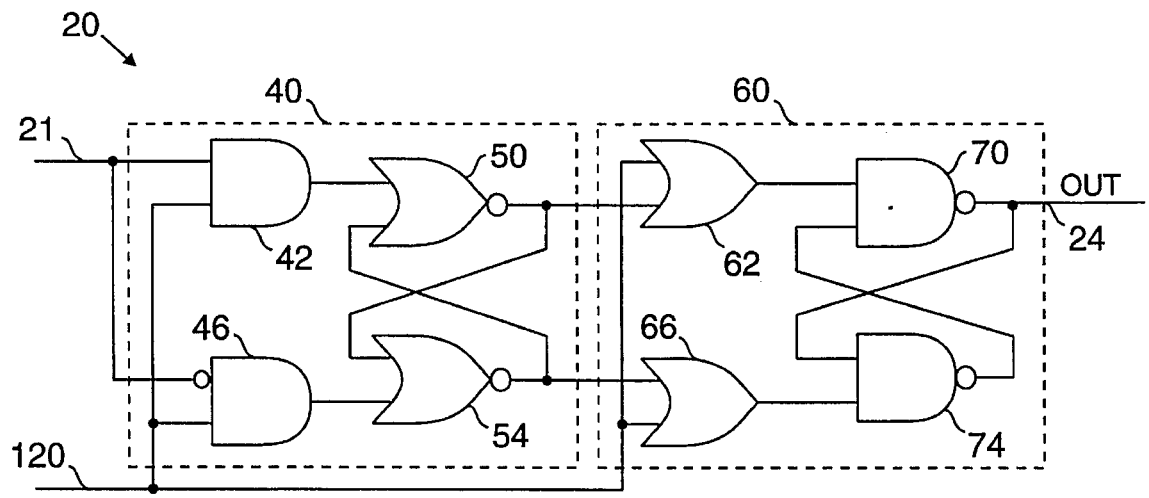
FIG. 2 illustrates an implementation of a master flip-flop and slave flip-flop that is typically used as the two-latch element in the circuit of FIG. 1.

A suitable circuit implementation of the two-latch element 20 as a master flip-flop 40 and a slave flip-flop 60 is shown in FIG. 2. The master flip-flop 40 consists of two dual-input AND gates 42 and 46 and two dual-input NOR gates 50 and 54. The slave flip-flop 60 consists of two dual-input OR gates 62 and 66 and two dual-input NAND gates 70 and 74.

The outputs of the AND gates 42 and 46 are, respectively, connected as inputs of the NOR gates 50 and 54. The outputs of the NOR gates 50 and 54 are cross-coupled to each other's input. The outputs of the NOR gates 50 and 54 are also connected as inputs to the OR gates 62 and 66 of the slave flip-flop 60, respectively. The outputs of the OR gates 62 and 66 are connected, respectively, as the inputs of the NAND gates 70 and 74. The outputs of the NAND gates 70 and 74 are cross-coupled to each other's input. The master input 21 is connected as an input to the AND gate 42 and as an inverted input to the AND gate 46. The clock line 120 is connected to one input of the AND gates 42 and 46, and to one input of the OR gates 62 and 66. The slave output 24 is connected to the output of the NAND gate 70.

The two-latch element 90 includes a master flip-flop 110 and a slave flip-flop 120 which are similar in structure and are connected in a fashion similar to that described above for the master and slave flip-flops 40 and 60 of the two-latch element 20. The combinational logic block 80 is any suitable digital circuit, consisting of AND, OR, NAND, NOR and NOT type of gates without any cross-coupled connection.

The two-latch element 20 operates in the following manner. When the clock line 120 is set high, an input signal state present at the master input 21 propagates into the master flip-flop 40. In other words, the master flip-flop 40 is active when the clock level is high, and the AND gates 42 and 46 permit the input signal at the master input 21 to propagate to the output of the cross-coupled NOR gates 50 and 54. The slave flip-flop 60 retains its previous state and is not affected by any changes occurring at the output of the NOR gates 50 and 54 of the master flip-flop 40 when the clock line 120 is high.

On the other hand, when the clock line 120 is set low, an input signal at the master input 21 does not propagate into the master flip-flop 40. The input signal present at the output of the master flip-flop 40, however, propagates from the input of the OR gates 62 and 66 to the slave output 24.

Figure 3:
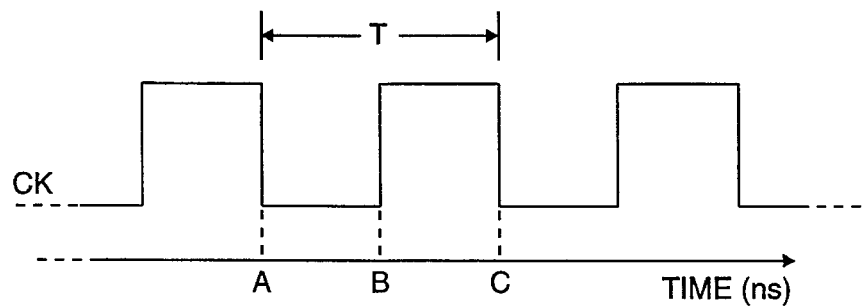
FIG. 3 illustrates a clock waveform that may be used for single clock operation of the circuit of FIG. 1.

Returning to FIG. 1, the operation of the circuit 10 at a rated frequency, $f_{rated}$, is explained to provide a background for describing how the circuit 10 may be modified for testing according to this invention. It is known that operation of the circuit 10 at $f_{rated}$ requires that the delay of the combinational signal path between the master input 21 and the output 84 must be less than the period of a clock waveform provided on the clock line 120. FIG. 3 shows the characteristics of a suitable clock waveform, CK, that may be provided on the clock line 120 for controlling the propagation of input signal states which would be applied at the master input 21. CK is a periodic waveform, with a period equal to T nanoseconds (ns). Consecutive falling edges of CK occur at times A and C. At time A, CK falls from the level of "1" or high to the level of "0" or low. CK remains low until time B, when it rises high. CK remains high until time C, when it falls low.

A signal state J which is applied at the master input 21 would propagate through the signal path of the circuit 10 in the following manner. For sake of example, the waveform CK is provided on the clock line 120 and the signal state J is applied at the master input 21 and stored in the master flip-flop 40 just prior to the falling edge of CK at time A. When the falling edge of CK occurs at time A, the state J at the master flip-flop 40 would transfer to the slave flip-flop 60 and commence to propagate from the output 24 of the latch 20 to the combinational logic block 80. Hereinafter, the falling edge in CK is called the closing edge because, after this edge, any change in the input signal state that appears at the master input 21 does not propagate through the master flip-flop 40. The signal state J also would remain stored in the latch 20, in other words, the signal state J would be present at the output 24 of the slave flip-flop 60, until the next closing edge of CK at time C. At time B, the rising edge of CK opens the master flip-flop 40. This would allow a next signal state K, which may be applied at the master input 21 subsequent to the signal state J, to propagate completely through the master flip-flop 40. Signal state K, however, would not enter the slave flip-flop 60 until time C.

Figure 4A:
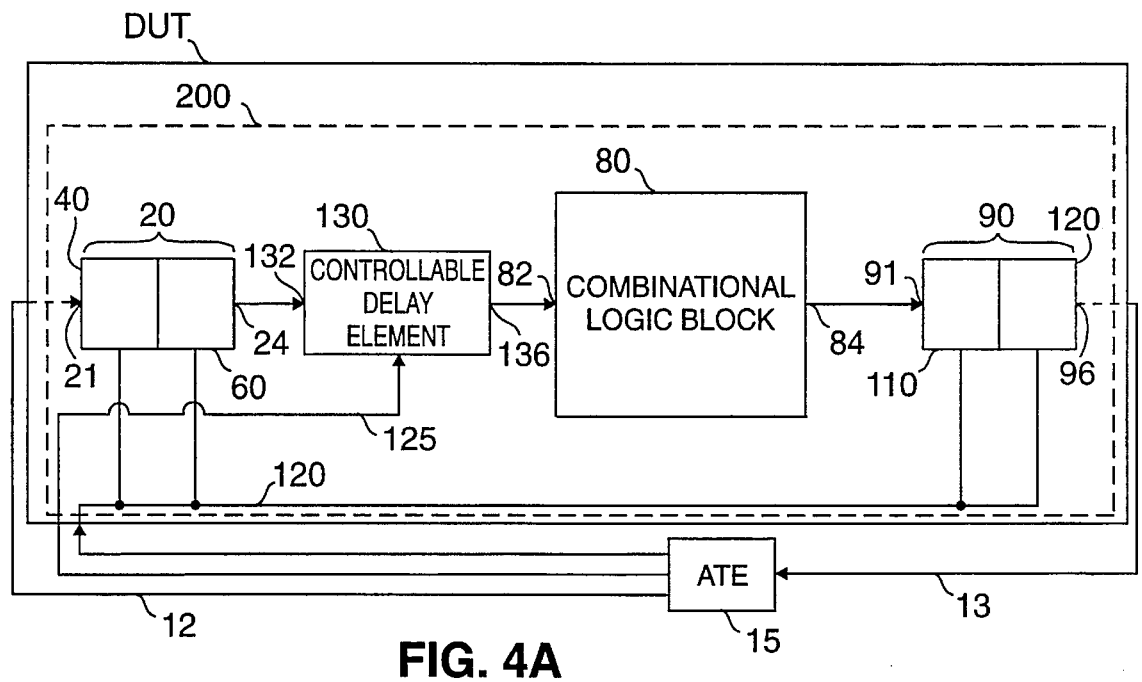
FIG. 4A illustrates the circuit shown in FIG. 1 modified according to the technique of the present invention to include a controllable delay element in the combinational signal path.

In a first embodiment of the present invention, the circuit 10 as described above may be modified by the inclusion of a controllable delay element 130 in the signal path so that the combinational logic block 80 may be tested by the ATE 15 at a test clock rate that is less than the rated frequency according to the present invention. FIG. 4A shows an ATE 15 suitably connected to a DUT including a circuit 200, which is a modified version of the circuit 10 that includes the controllable delay element 130. Those components in the circuit 200 as well as other circuits introduced below which are similar, and preferably identical, to the components in the circuit 10 are referred to using the same reference numerals utilized in FIGS. 1 and 2.

In the circuit 200, the controllable delay element 130 is connected between the slave output 24 and the input 82 of the combinational logic block 80. A control line 125 is connected from the ATE 15 to the controllable delay element 130. The control line 125 is a primary input of the circuit 200. The controllable delay element 130 may suitably be a static or dynamic delay element, such as a cross-coupled gate latch or a metal-oxide semiconductor (MOS) pass transistor, respectively, that has a small finite delay, and is preferably comprised of relatively few logic elements.

Figure 4B:
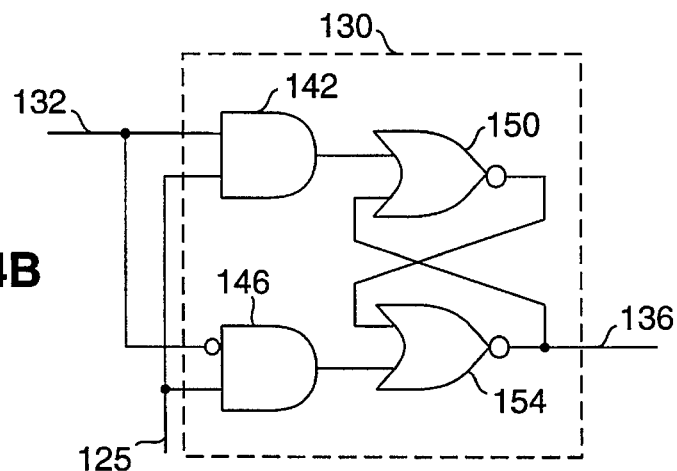
FIG. 4B illustrates a suitable controllable delay element that may be used in the circuit of FIG. 4A.

FIG. 4B shows the controllable delay element 130 embodied as a static, level sensitive flip-flop. In this form, the controllable delay element 130 is comprised of two dual-input AND gates 142 and 146 and two dual-input NOR gates 150 and 154. The outputs of the AND gates 142 and 146 are, respectively, connected as inputs of the NOR gates 150 and 154. The outputs of the NOR gates 150 and 154 are cross-coupled to each other's input.

Referring to FIGS. 4A and 4B, the slave output 24 is connected to a data input 132 of the controllable delay element 130. The data input 132 is connected as an input to the AND gate 142 and as an inverted input to the AND gate 146. The control line 125 is connected to one input of the AND gates 142 and 146. The output of the NOR gate 154 is connected to an output 136 of the controllable delay element 130. The output 136 is connected to the input 82 of the combinational logic block 80. Alternatively, the output of the NOR gate 150 may be connected to the output 136, depending upon whether the design of the circuit 200 requires that a complementary form of the signal must be provided at the input 82 of the combinational logic block 80.

The controllable delay element 130 shown in FIG. 4B operates in the following manner. When the control line 125 is set high, the controllable delay element 130 is said to be in a propagation state. In the propagation state, the signal state at the data input 132 propagates through the controllable delay element 130. In contrast, when the control line 125 is set low, the controllable delay element 130 is said to be in a store state. In the store state, the signal state at the slave input 132 does not propagate through the controllable delay element 130.

Figure 5A:
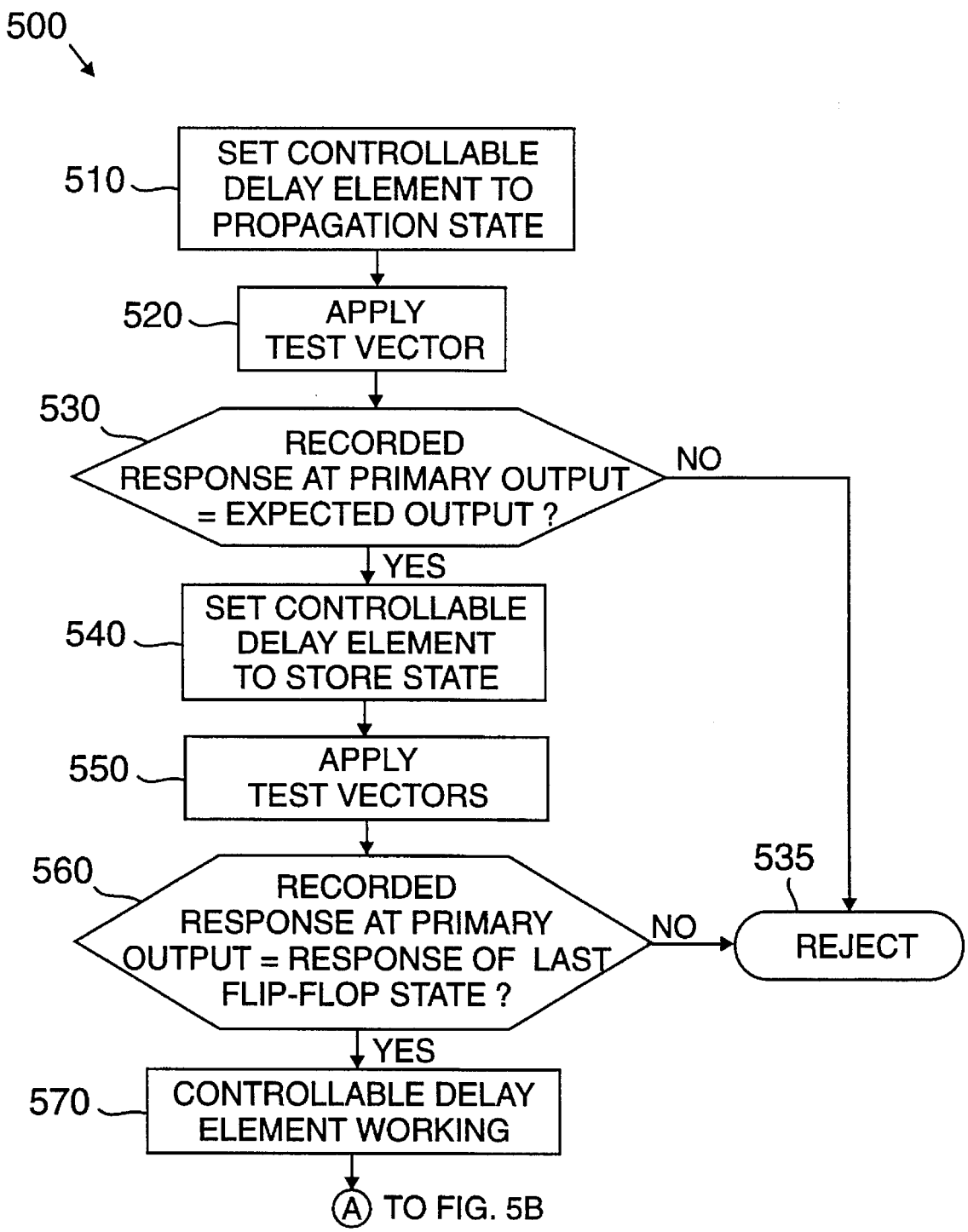
FIG. 5A is a flow diagram of a method for testing the controllable delay element shown in FIG. 4A according to the present invention.

ATE testing of the circuit 200 requires testing of the logical operation of the controllable delay element 130 and testing of the timing operation of the combinational logic block 80. First, the ATE 15 may perform a process 500, as shown in FIG. 5A, for testing the logical operation of the controllable delay element 130, in other words, testing whether the controllable delay element 130 operates properly in the propagation and store states. Upon completion of testing of the controllable delay element 130, ATE testing of the combinational logic block 80 for proper operation at the rated frequency using a slower test clock rate may be performed in the manner described in further detail below in connection with FIG. 5B.

Referring to FIG. 5A, in step 510, the ATE 15 sets the control line 125 to a logic level high in order to test whether the controllable delay element 130 operates properly in the propagation state. The application of this logic level on the control line 125 should connect the data input 132 of the controllable delay element 130 to its output 136, such that the controllable delay element 130 is made transparent in the timing path of the circuit 200. Step 520 is then executed.

In step 520, the ATE 15 applies a suitable test stimulus to the master input 21 over the input line 12. As described in Agrawal & Seth, supra, a test stimulus may comprise one or more functional inputs or test vectors which are applied to a primary input of a circuit for detecting stuck-at faults and testing the propagation delay in a combinational logic block in the circuit. Step 530 is then executed.

In step 530, the ATE 15 records the response at the output 84 which is provided over the output line 13, and determines whether the recorded response agrees with an expected correct response. In this circumstance, the expected response is that a test stimuli which is applied at the master input 21 should propagate through the controllable delay element 130 and appear at the output 84. If the recorded response differs from the expected response, the ATE 15 provides an indication in step 535 that the circuit is not working. ATE testing on the circuit stops, and the circuit is rejected as faulty. On the other hand, if the recorded and expected responses match, the controllable delay element 130 under test functions correctly in the propagation state, and the ATE 15 proceeds to perform step 540.

In step 540, the ATE 15 sets the control line 125 to a logic level low in order to test whether the controllable delay element 130 operates properly in the store state. For this logic state, any change in the input signal state which is applied at the master input 21 should be prevented from propagating through the circuit 200 because the data input 132 of the controllable delay element 130 should become disconnected from the output 136. Step 550 is then executed.

In step 550, the ATE 15 applies a suitable test stimulus for testing the store state of the controllable delay element 130. In step 560, the ATE 15 records the response at the output 84 which is provided over the output line 13, and determines whether the recorded response agrees with the expected response, which, in the step 560, is the response corresponding to the signal state present at the last flip-flop state from testing of the propagation state in steps 510 to 530. If the recorded response matches the expected response, the ATE 15 in step 570 provides an indication that the controllable delay element operates correctly for both the store and propagation state. Otherwise, the ATE 15 performs step 535.

If ATE testing determines that the logical operations of the controllable delay element 130 function properly, the combinational logic block 80 may be tested by the ATE 15 using test stimuli applied at a slower test clock rate, $f_{test}$, according to the present invention.

It is well known that ATE testing of a combinational signal path which includes a combinational logic block requires that the period, $T_{test}$, of the test clock waveform exceed the sum of all delays in that signal path. The present invention calls for the addition of a calculated amount of delay, $\Delta$, to this signal path in order to decrease the amount of time that a test stimulus applied at $f_{test}$ would have for propagating through the combinational logic block. As seen in the circuit 200, the addition of the calculated amount of delay $\Delta$ to the signal path under test may be used for simulating the testing of the combinational logic block 80 at $f_{rated}$, because the addition of this delay would require a test stimulus applied at $f_{test}$ to propagate through the combinational logic block 80 at $f_{rated}$ in order that it may arrive at the output 84 prior to the end of $T_{test}$.

An equation for calculating the amount of delay $\Delta$ which must be added to a signal path to simulate testing of a combinational logic block at $f_{rated}$ using a slower clock rate $f_{test}$ is derived as follows. It is known that $T_{test}$ must exceed the sum of the maximum delay of the signal paths which are included in the combinational logic block under test, called $t_{max}$, and any delay $\Delta$ that may be added to the signal path, such that $T_{test} \geq t_{max} + \Delta$. To optimize testing according the present invention, $T_{test}$ would be set equal to $t_{max} + \Delta$. By substituting the period of the rated clock rate or $1/f_{rated}$ for $t_{max}$ and $1/f_{test}$ for $T_{test}$ into this equation, it may be rewritten in terms of frequency as $\Delta = (f_{rated} - f_{test})/(f_{rated} \cdot f_{test})$. It is noted that a controllable delay element, such as the controllable delay element 130 in the circuit 200, will have an inherent finite delay, even when it is manipulated in the manner described below to produce zero delay. For purposes of this description, the finite delay of the controllable delay element is included in $t_{max}$.

FIG. 5B shows a process 600 that may be performed by the ATE 15 for testing the combinational logic block 80 in the circuit 200 using a slow test clock rate $f_{test}$ according to the present invention. In step 610, the ATE 15 calculates $\Delta$ for the circuit 200 based on the values of $f_{rated}$ and $f_{test}$ using the equation set forth above. It is to be understood that the delay value $\Delta$ may be calculated manually and suitably provided to the ATE 15 according to techniques well known in the art.

In step 620, the ATE 15 generates a test clock waveform CK, as shown in FIG. 6A, for controlling the propagation of test vectors through the circuit 200, and a second test clock waveform CONTROL, as shown in FIG. 6B, for manipulating the controllable delay element 130 so that the calculated delay $\Delta$ is added to the signal path of the circuit 200. CK has the same characteristics as the CK waveform described in FIG. 3, except that it has a period equal to $T_{test}$. CONTROL also has a period equal $T_{test}$. CONTROL and CK both have consecutive falling edges which occur at times A and C. CONTROL, however, after falling from high to low at time A, remains low for a time interval equal to $\Delta$. At the end of the time interval $\Delta$, CONTROL rises high and then remains high until the time C, where it falls low. As seen from FIG. 6B, the amount of delay $\Delta$ which may be added to the combinational signal path is controlled by varying the pulse width of the waveform CONTROL. For a fixed test clock frequency, Δ is a linear function of the pulse width of CONTROL.

In step 630, the ATE 15 applies a suitable test vector to the master input 21 of the circuit 200 in accordance with the generated waveforms CONTROL and CK, which are applied at control line 125 and clock line 120, respectively. For the sake of example, the test vector comprises an input signal state J which is present at the master input 21 just prior to the falling edge of CK at time A.

In step 640, the ATE 15 records the response at the primary output of the circuit 200, and then determines whether the recorded response agrees with an expected stored response which is previously simulated based on the design of the circuit 200. As explained above, the intended operation of the circuit 200 is that a signal state should propagate through the combinational logic block 80 within one clock period. In step 650, the ATE 15 provides an indication whether operation at $f_{rated}$ is guaranteed for the circuit 200, in other words, whether the combinational logic block 80 operates properly at the rated frequency based on the comparison performed in step 640.

For the circuit 200, the expected propagation of the signal state J, which is applied to the signal path in accordance with the waveforms CK and CONTROL, is as follows: At the closing edge of CK at time A, the signal state J at the master input 21 of the master flip-flop 40 should begin to propagate through the master flip-flop 40 and the slave flip-flop 60. The signal state J, however, should be blocked from propagating to the combinational logic block 80 by the controllable delay element 130, because CONTROL falls low at time A. Only after a delay of Δ, when CONTROL rises high, should the signal state J, which is present at the output 24 of the slave flip-flop 60, propagate through the controllable delay element 130 and to the combinational logic block 80. Thus, for the signal state J to be recorded at the output 84 before the falling edge of CK occurs at time C, the signal state J must propagate through the combinational logic block 80 in the interval equal to $T_{test}-\Delta$, in other words, at the speed equal to $f_{rated}$.

Therefore, the prior art limitation of testing high speed circuits is overcome. A slower test clock signal may be used for testing the frequency performance of a high speed circuit.

Figure 7A:
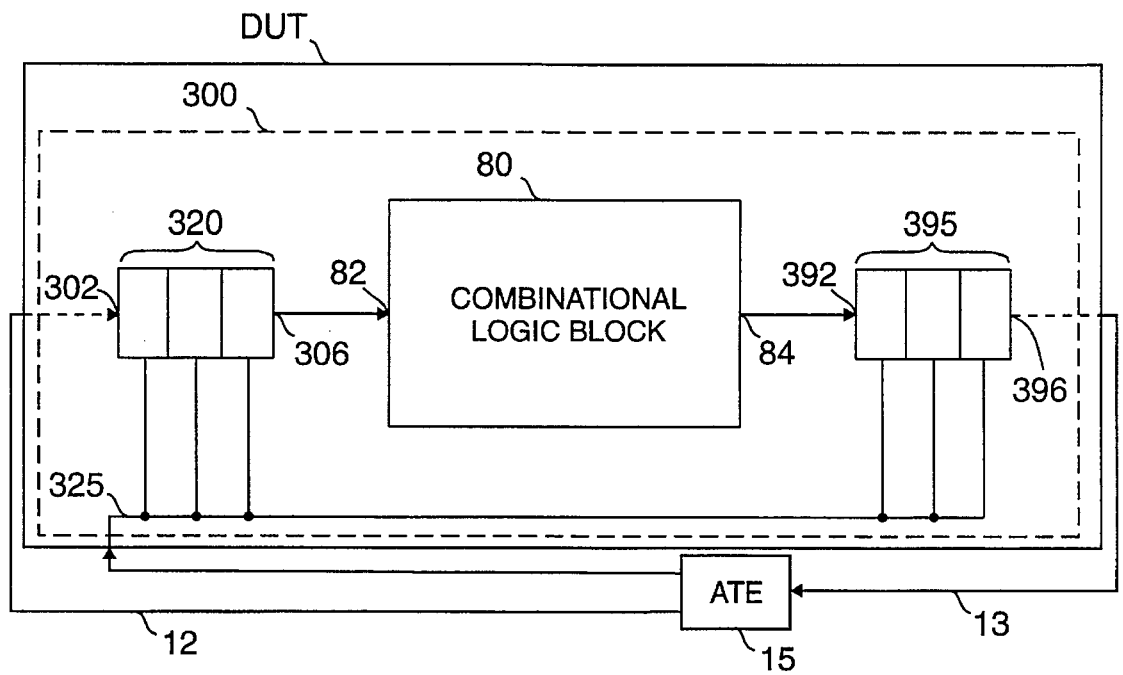
FIG. 7A illustrates a combinational signal path in a single-clock synchronous high speed digital circuit which includes a controllable delay element in a three-latch element.

In an alternative embodiment, the prior art circuit 10 may be modified according to the present invention by introducing a controllable delay element as part of the clocked latch elements 20 and 90. This embodiment eliminates the need for generating an extra signal waveform for controlling the addition of delay to the signal path by manipulating the inserted controllable delay element. FIG. 7A shows an ATE 15 connected to a DUT including a circuit 300 which illustrates this modification to the circuit 10. As explained below, testing of the circuit 300 is performed using only a single signal clock input, which is also used for controlling the addition of delay to the signal path.

The circuit 300 is comprised of a combinational logic block 80 which is connected between a first three-latch element 320 and a second three-latch element 395. The three-latch element 320 includes an input 302 and an output 306. Similarly, the three-latch element 395 includes an input 392 and an output 396. The output 306 is connected to the input 82 of the combinational logic block 80. The input 392 is connected to the output 84 of the combinational logic block 80.

A clock line 325 is a primary input of the DUT and is directly connected from the ATE 15 to the three-latch elements 320 and 395, as described in greater detail below. The input line 12 is connected from the ATE 15 to a primary input of the DUT, which is directly or indirectly connected to the input 302. Similarly, the output line 13 is connected from the ATE 15 to a primary output of the DUT, which is directly or indirectly connected to the output 396.

Figure 7B:
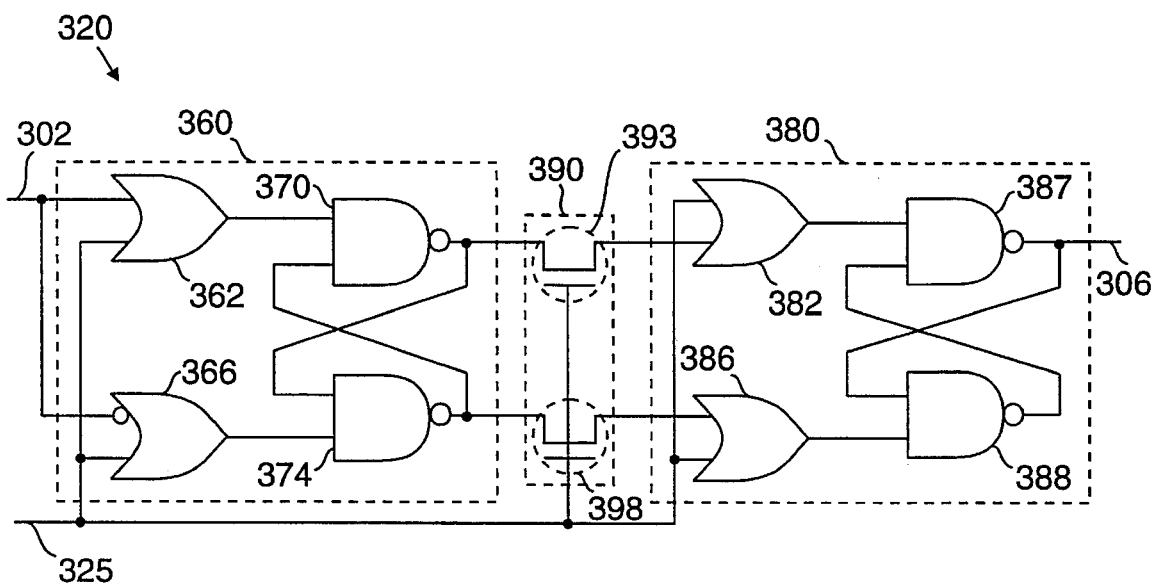
FIG. 7B illustrates a dynamic controllable delay element that may be included as part of the three-latch element in the circuit of FIG. 7A.

FIG. 7B shows a suitable implementation of the three-latch element 320. The three-latch element 320 is comprised of a latch flip-flop 360, a controllable delay element 390 and a latch flip-flop 380. The latch flip-flop 360 comprises two dual-input OR gates 362 and 366 and two dual-input NAND gates 370 and 374. The controllable delay element 390 is suitably a pulse-triggered flip-flop which is comprised of pass transistors 393 and 398. The latch flip-flop 380 comprises two dual-input OR gates 382 and 386 and two dual-input NAND gates 387 and 388.

The outputs of the OR gates 362 and 366 are, respectively, connected as inputs of the NAND gates 370 and 374. The outputs of the NAND gates 370 and 374 are cross-coupled to each other's input. The outputs of the NAND gates 370 and 374 are connected to the sources of the pass transistors 393 and 398, respectively. The drains of the pass transistors 393 and 398 are connected, respectively, to the inputs of OR gates 382 and 386. The output of the OR gates 382 and 386 are connected, respectively, as the inputs of the NAND gates 387 and 388. The outputs of the NAND gates 387 and 388 are cross-coupled to each other's input. The input 302 is connected as an input to the OR gate 362 and as an inverted input to the OR gate 366. The clock line 325 is connected to one input of each of the OR gates 362, 366, 382 and 386, and the gates of the transistors 393 and 398. The output 306 is connected to the output of the NAND gate 387.

The three-latch element 320 is controlled by a clock waveform provided on the clock line 325, such that the controllable delay element 390 functions as an intermediate clocked latch element. The latch flip-flops 360 and 380 are sensitive to a low level on the clock line 325. These flip-flops are active low, or, in other words, signal states propagate through these flip-flops when the level on the clock line is low. The controllable delay element 390, however, blocks the propagation of signals when the clock line 325 is set low. In other words, when the clock line 125 is high, the controllable delay 390 allows the propagation of input signals, whereas the latch flip-flops 360 and 380 block the propagation of input signals. The three-latch element 395 is similar in structure and operates in a similar manner as described above for the three-latch element 320.

Figure 7C:
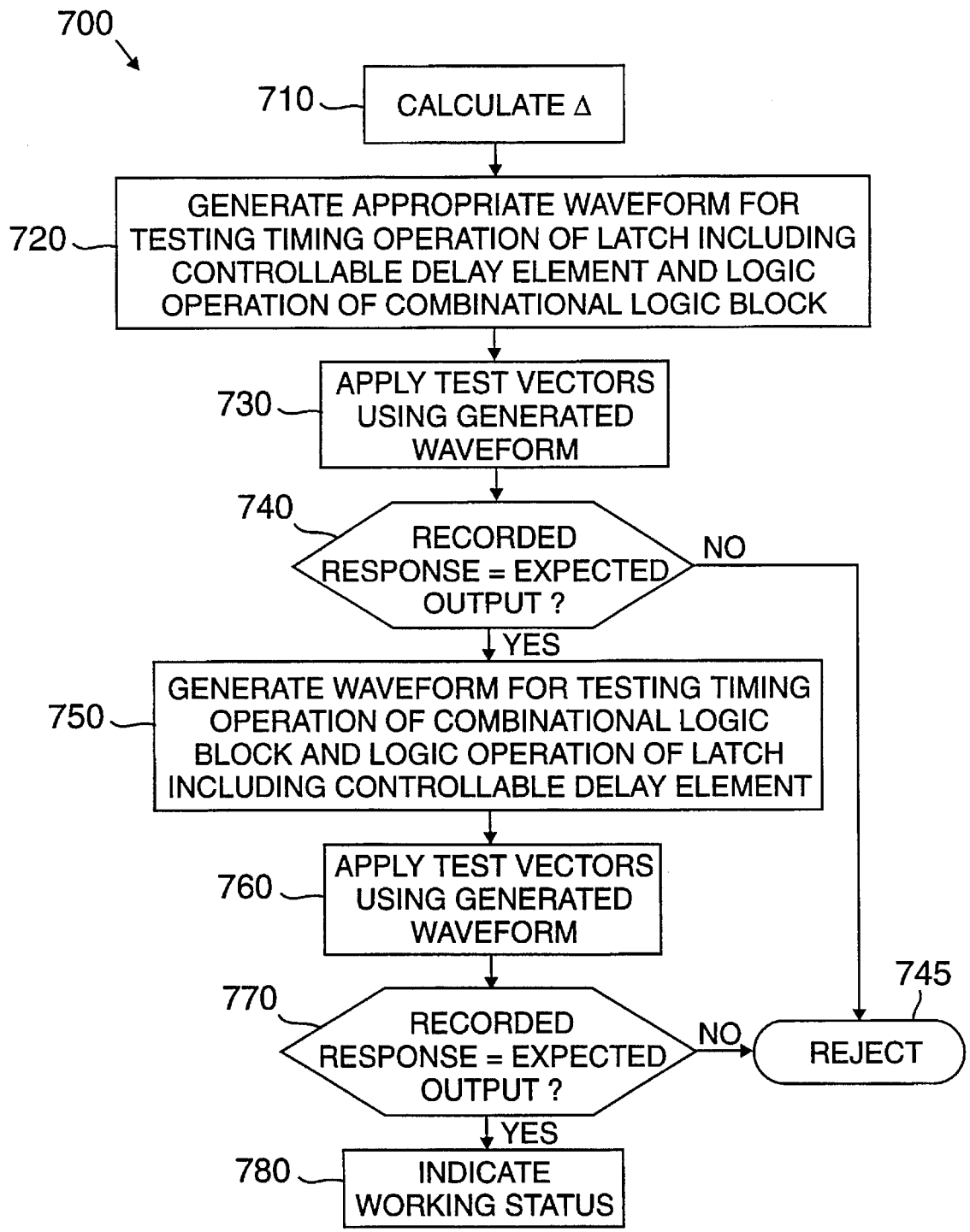
FIG. 7C is a flow diagram of a method for testing the combinational logic element in the circuit of FIG. 7A at the test clock rate.

ATE testing of the circuit 300 is performed according to the method of this invention in two stages by use of a process 700 which is shown in FIG. 7C. First, in steps 710 to 740, the ATE 15 tests the timing operation of the three-latch element 320 which includes the controllable delay element 390, and the logic operation of the combinational logic block 80. Then, in steps 750 to 780, the ATE 15 tests the logic operation of the three-latch element 320 which includes the controllable delay element 390, and the timing operation of the combinational logic block 80. Hereinafter, testing of the three-latch element 320 which includes the controllable delay element 390 is, for ease of reference, referred to as testing of the controllable delay element 390.

In step 710, the ATE 15 calculates a delay value Δ in the same manner as in step 610 of the process 600. After performing step 710, the ATE 15 in step 720 generates a test clock waveform CK(NORMAL), as shown in FIG. 8A.

CK(NORMAL) is a waveform which has a period equal to $T_{test}$ and consecutive rising edges that occur at times D and G. CK(NORMAL) remains high starting from the time D for an interval equal to $T_{test}-t_{max/NORMAL}$, after which it falls low at time E. CK(NORMAL) then remains low for an interval equal to $t_{max/NORMAL}$, after which, at time G, it rises high. The expected propagation of test stimuli in the circuit 300 which are applied in accordance with CK(NORMAL) is described below.

In step 730, the ATE 15 supplies a suitable test vector over the input line 12 for application to the input 302 and CK(NORMAL) to the control line 325. For the purposes of example, the test vector comprises an input signal state J which is present at the input 302 just prior to the rising edge of CK(NORMAL) at time E. The ATE 15 then, in step 740, records the output response at the output 84 over the output line 13, and based on the expected response, determines whether (1) an input signal state has propagated completely through the controllable delay element 390 at the rated speed, and (2) whether the combinational logic block 80 operates properly for high and low logic input levels. If the recorded and expected responses do not match, then in step 745, the ATE 15 provides an indication that the circuit is not working. ATE testing stops, as the circuit is rejected as faulty. Otherwise, if the recorded and expected responses match, the ATE 15 proceeds to perform the second stage of the process 700 at step 750.

The expected propagation of the test signal state J through the signal path of the circuit 300 is now described with respect to the applied waveform CK(NORMAL). When CK(NORMAL) is applied to the circuit 300, the clock line 325 assumes a level of "1" beginning at time D for a short period which should be long enough for the signal state J to be transmitted through the controllable delay element 390 and be set up at the output 306. When CK(NORMAL) falls low at time E, the output 306 should hold the signal state J for the remainder of the period when CK(NORMAL) is low. In other words, when CK(NORMAL) is low from time E until time G, only the signal state J should continue to propagate through the signal path. If these two conditions occur as expected, the controllable delay element 390 operates properly at the rated clock rate.

Further, if the logical operations of the combinational logic block 80 function properly, then the signal state J should propagate from the output 306 and through the combinational logic block 80 in the remainder of the period when CK(NORMAL) is low and appear at the output 84 prior to the time G. Therefore, for the circuit 300, the expected propagation of the signal state J through the signal path in accordance with the applied waveform CK(NORMAL) is that the signal state J should be recorded at the output 84 before the time G.

Returning to the description of the process 700, in step 750, the ATE 15 generates a test clock waveform CK(TEST), as shown in FIG. 8B, for testing the timing operation of the combinational logic block 80 and the logic operation of the controllable delay element 390. CK(TEST) is a waveform having a period equal to $T_{test}$ and consecutive rising edges that occur at times D and G. CK(TEST) has similar characteristics as CK(NORMAL), except that the length of time that the pulse remains high in CK(TEST), as measured from the time D, is increased by an amount equal to $\Delta$, as calculated by the ATE 15 in step 710. As shown in FIG. 8B, CK(TEST) is high from the time D to a time F. The length of time that the pulse is low in CK(TEST) is therefore equal to $t_{max/NORMAL}-\Delta$ or $t_{max/TEST}$. The expected propagation of test stimuli in the circuit 300 which is applied in accordance with CK(TEST) is described below.

In step 760, the ATE 15 supplies a suitable test vector for application to the input 302 in accordance with CK(TEST), which is supplied on the control line 325. For the sake of example, the test vector comprises an input signal state J which is present at the input 302 just prior to the rising edge of CK(TEST) at time D.

The ATE 15 then, in step 770, records the output response at the output 84 over the output line 13, and based on the expected response, determines (1) whether an input signal state propagates completely through the combinational logic block 80 at the rated speed, and (2) whether the logic operations of the controllable delay element 390 operate properly. If the recorded and expected responses do not match, the ATE 15 provides an indication in step 745 that the circuit 200 is faulty. If the expected response matches the recorded response, the ATE 15 in step 780 provides an indication that the circuit 200 operates correctly at the rated frequency.

The expected propagation of the test signal state J through the signal path of the circuit 300, which is applied in step 760 in the process 700, is now described with respect to the applied waveform CK(TEST). It is known that increasing the pulse width of CK(NORMAL) by $\Delta$, as explained above, to produce the waveform CK(TEST) serves to add a delay $\Delta$ to the signal path of the circuit 300 before the combinational logic block 80. With the addition of this delay to the signal path, the effect of the signal state J which is applied just prior to time D will appear at the output 84 before the time G only if the signal state J propagates through the combinational logic block 80 in a time interval that is less than or equal to $t_{max/NORMAL}-\Delta$ or $t_{max/TEST}$. In other words, the signal state J would have to propagate through the combinational logic block 80 at $f_{rated}$ in order to arrive at the output 84 before time G. If this occurs, the combinational logic block 80 operates properly at the rated clock rate.

Also, if the effect of the signal state J is recorded at the output 84 before the time G, then the logical functions of the controllable delay element 390 operate properly because the signal state J would have been properly transferred from the input 302 to the output 306 as CK(TEST) changed from low to high to low during the time interval extending from just prior to D to just prior to time G. Therefore, as in the first stage of testing using CK(NORMAL), the expected propagation of the signal state J through the signal path in accordance with the applied waveform CK(TEST) also is that the signal state J should be recorded at the output 84 before the time G.

In another alternative embodiment, a combinational logic block in a multi-clock synchronous high speed digital circuit may be tested at a slower test clock rate according to the present invention by suitably modifying the plurality of clocks applied to the circuit. As described in further detail below, a calculated amount of delay may be introduced into a combinational signal path of such a circuit by phase shifting or skewing one clock relative to all of the other clocks. The addition of the delay to the signal path allows testing at the slower test clock rate in a manner which is similar to that described above for the single clock embodiment of the present invention. By way of example, a DUT including a two-clock synchronous high speed digital circuit 400 and suitably connected to an ATE 15 is shown in FIG. 9 and described below to illustrate the application of the present invention to a multi-clock circuit.

The circuit 400 is comprised of the same components and connections as described for the circuit 10, except that the master flip-flop 40 and the slave flip-flop 60 are connected to separate clock lines, respectively. In the circuit 400, the clock line 120 of the circuit 10 is replaced by a master clock line 330 which is connected to the master flip-flop 40 and by a slave clock line 340 which is connected to the slave flip-flop 60.

Figure 10A:
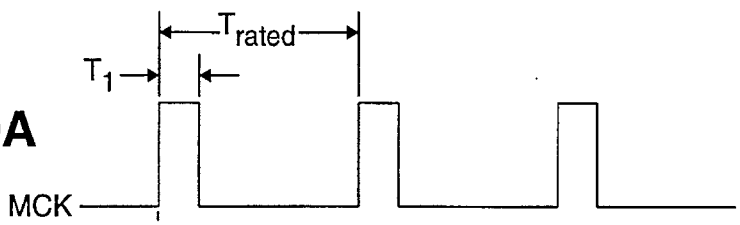
FIGS. 10A and 10B illustrate the clock waveforms that may be applied during operation of the circuit in FIG. 9 at the rated frequency.
Figure 10B:
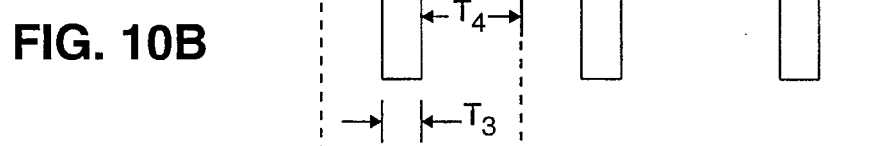

The propagation of input signal states in the circuit 400 is controlled by the clock waveforms that are supplied on the master clock line 330 and the slave clock line 340. FIGS. 10A and 10B show a suitable master clock waveform signal (MCK) and slave clock waveform signal (SCK) that may be provided on the master clock line 330 and the slave clock line 340, respectively, during operation of the circuit 400 at $f_{rated}$. MCK and SCK are periodic waveforms having a period equal to $T_{rated}$. $T_{rated}$ consists of four time intervals, $T_1$, $T_2$, $T_3$ and $T_4$. The characteristics of MCK and SCK are described below with respect to a periodic interval which extends from times L to M.

The consecutive rising edges of MCK occur at times L and M. MCK is high for a time interval which starts at time L and is equal to $T_1$. After the interval $T_1$, MCK falls low and remains low for a time interval which extends until the time M and is equal to $T_{rated}-T_1$.

SCK is also high at time L. SCK remains high for a time interval which starts at time L and is equal to $T_1+T_2$, after which, SCK falls low. SCK then remains low for a time interval equal to $T_3$, after which, SCK rises high. SCK then remains high until time M. The time interval between the end of the $T_3$ interval and the time M is equal to $T_4$.

An input signal state which is applied to the circuit 400 in accordance with MCK and SCK would propagate through the signal path in the following manner. In the first place, the input signal state may propagate through the master flip-flop 40 only for the duration $T_1$ that the master flip-flop 40 remains open. $T_1$ is known as the set-up time of the master flip-flop 40, and is approximately equal to the time that a signal will take to propagate through the flip-flop 40.

Once latched in the master flip-flop 40, the input signal must propagate through the master flip-flop 40 and appear at the input of the slave flip-flop 60 by the end of the time interval $T_2$. At the beginning of the interval $T_3$, the slave flip-flop 60 opens so as to allow the input signal state at the input of the slave flip-flop 60 to begin propagating from the slave flip-flop 60 and through the combinational logic block 80. $T_3$ is the set-up time of the slave flip-flop 60. The signal state must arrive at the master flip-flop 110 of the latch 90 at the other end of the combinational logic block 80 before the master flip-flop 110 closes. Thus, the maximum delay, $t_{max}$ through the combinational logic block 80 must be less than the interval $T_4$ or less than $T_{rated}-T_1-T_2-T_3$ such that $t_{max}<T_4$ or $t_{max}<T_{rated}-T_1-T_2-T_3$.

Figure 10C:
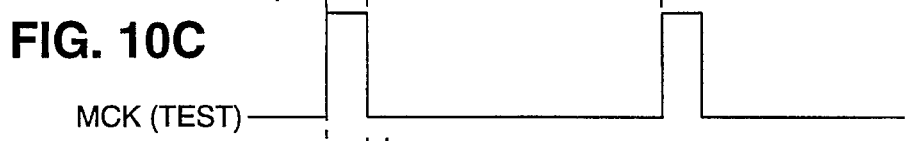
FIGS. 10C and 10D illustrate the clock waveforms that may be applied during testing of the circuit in FIG. 9 at the test frequency.
Figure 10D:
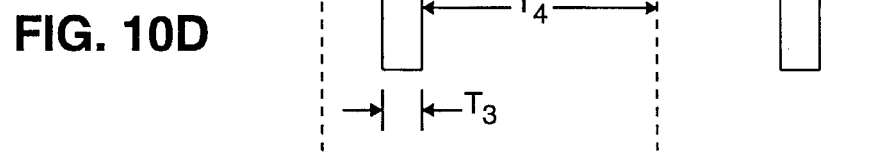

At this point, the clock waveforms MCK(TEST) and SCK(TEST), as shown in FIGS. 10C and 10D, respectively, are described to provide a better understanding of how the circuit 400 may be tested according to the present invention using test stimuli applied at $T_{test}$. The MCK(TEST) and SCK(TEST) waveforms have a period equal to $T_{test}$, and are described below with respect to the periodic interval defined between the times L and N. The waveforms MCK(TEST) and SCK(TEST), respectively, are similar to MCK and SCK, except that the $T_4$ interval is appropriately increased to account for the time interval differences between $T_{test}$ and $T_{rated}$.

If testing of the high speed circuit 400 were to be performed at a slower speed, $f_{test}$, by applying test stimulus to the signal path in accordance with the waveforms MCK(TEST) and SCK(TEST), it is noted that the period of the test clock rate $T_{test}$ would be much larger than $t_{max}$. Therefore, even if the circuit 400 contains delay faults such that $t_{max}$ would exceed $T_{rated}-T_1-T_2-T_3$, the circuit 400 may still pass testing at $f_{test}$ because $t_{max}$ may still be less than $T_{test}-T_1-T_2-T_3$.

Figure 11A:
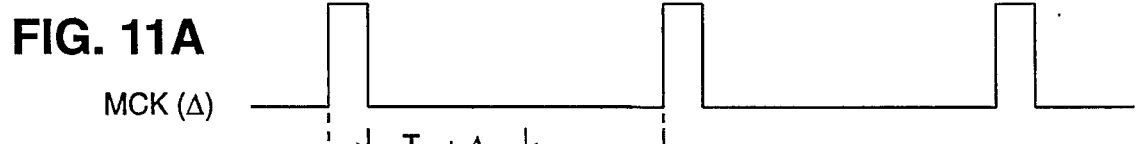
FIGS. 11A and 11B illustrate the clock waveforms that may be applied to the circuit in FIG. 9 for controlling the amount of delay that is added to the combinational signal path according to the method of the present invention.
Figure 11B:
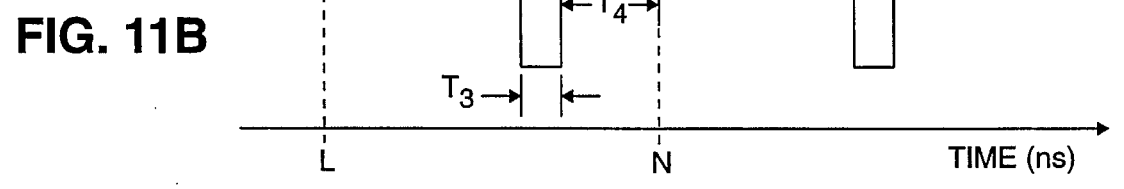

According to the present invention, the extra propagation time allowed by the larger period of the test clock $T_{test}$ over that of the rated clock $T_{rated}$ is compensated for by modifying the MCK(TEST) and SCK(TEST) waveforms to produce the clock waveforms MCK($\Delta$) and SCK($\Delta$), as shown in FIGS. 11A and 11B, respectively, which may be used for applying test vectors to the circuit 400 during testing at $f_{test}$. The waveforms MCK($\Delta$) and SCK($\Delta$) differ from the waveforms MCK(TEST) and SCK(TEST) in that a delay $\Delta$ is added to the $T_2$ interval and the $T_4$ interval is reduced by the same amount $\Delta$. The amount of delay $\Delta$ that is suitably added and subtracted from the MCK(TEST) and SCK(TEST) is equal to $T_{test}-T_{rated}$.

The addition of the delay $\Delta$ in the manner described above essentially creates a phase shift between the clock signals on the master clock line 330 and the slave clock line 340. This phase shift effectively delays the propagation of a signal state from the master flip-flop 40 to the slave flip-flop 60 by a time interval equal to $\Delta$. Therefore, for ATE testing at $f_{test}$, a test input signal state applied at the time L at the master input 21 of the circuit 400 in accordance with MCK($\Delta$) and SCK($\Delta$) must propagate through the combinational logic block 80 at $f_{rated}$ in order that it may arrive at the output 84 before time N. One skilled in the art may easily take advantage of the above described inventive technique and design an ATE test routine similar to the process 600 for simulating the testing of the combinational logic block 80 of the circuit 400 at $f_{rated}$.

It is further noted that a complete test of the circuit 400 requires testing of the logic operation of the latches 20 and 90. An ATE testing routine may be designed by one skilled in the art that would easily allow for this determination to be made. The test routine would involve the application of test vectors to the circuit 400 in accordance with the waveforms MCK(TEST) and SCK(TEST) in a manner similar to that described above. If the test vectors produce the expected correct response at the primary output of the circuit 400, it may be concluded that the latches 20 and 90 perform correctly because the characteristics of the test clock waveforms MCK(TEST) and SCK(TEST) during the intervals $T_1$, $T_2$ and $T_3$ are exactly the same as that which would be present in a rated clock signal, such as the waveforms MCK and SCK.

Figure 12:
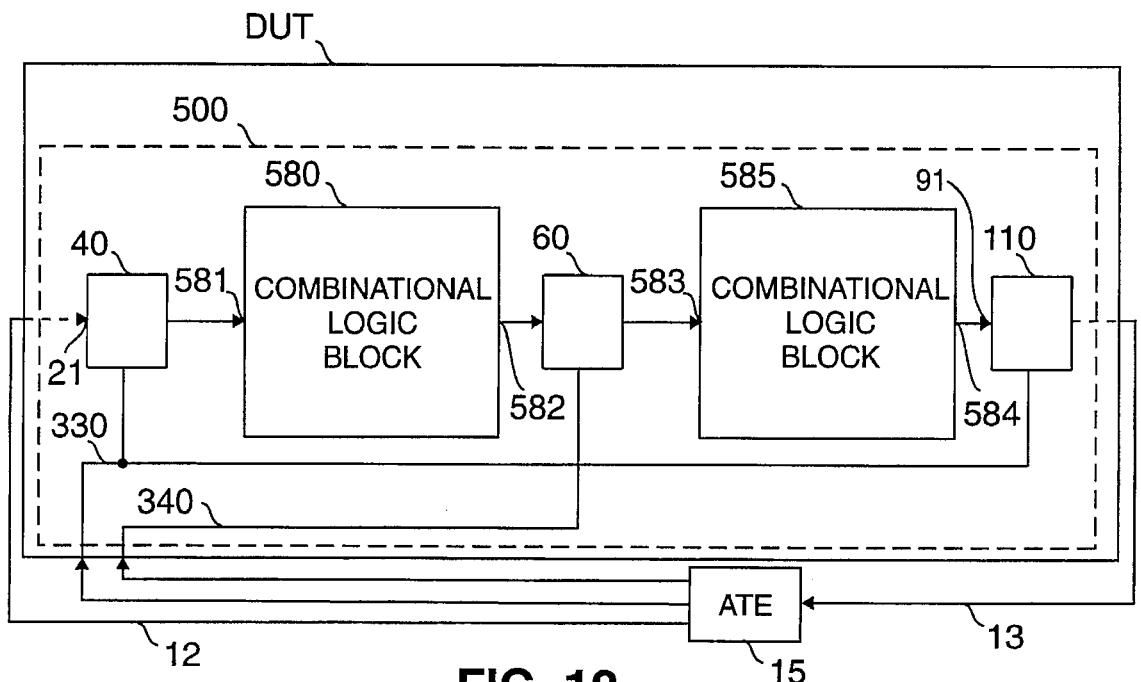
FIG. 12 illustrates a combinational signal path in a two-clock synchronous high speed digital circuit that includes a plurality of combinational logic elements which are located between a plurality of master and slave flip-flops, respectively.

In a further embodiment, the present invention may also be applied for testing a synchronous two-clock high speed digital circuit which has a combinational logic block split into two separate combinational logic blocks. FIG. 12 shows an ATE 15 connected to a DUT including a circuit 500 which is similar in structure to the circuit 400, except that the combinational logic block 80 is replaced by combinational logic blocks 580 and 585, which are connected in the circuit 500 in the manner described below.

An input 581 of the combinational logic 580 is connected to either the output of NOR gate 50 or NOR gate 54 of the master flip-flop 40, depending upon whether the combinational logic block 580 is designed to receive a complementary or a non-complementary output. An output 582 of the combinational logic block 580 is connected to the input of OR gates 62 and, in complemented form, to the input of OR gate 66, of the flip-flop 60. An input 583 of the combinational logic block 585 is connected to either the output of the NAND gate 70 or the NAND gate 74 of the slave flip-flop 60, depending upon whether the combinational logic block 585 is designed to receive a complementary or a non-complementary output. An output 584 of the combinational logic block 585 is connected to the master input 91 of the master flip-flop 110.

As in the circuit 400, all the master flip-flops in the circuit 500 are connected to a master clock line 330 and all the slave flip-flops are connected to a slave clock line 340. The maximum timing path delays for the combination logic blocks 580 and 585, as located between the clocked elements, are equal to $t_{1max}$ and $t_{2max}$, respectively.

The propagation of signal states through the circuit 500 at the rated frequency may be described with reference to the clock waveforms shown in FIGS. 10A and 10B. If the delays $t_{1max}$ and $t_{2max}$ of the two combinational logic blocks 580 and 585 are equal, suitable waveforms at the rated clock rate may be provided by setting the interval $T_2$ equal to $T_4$ in the MCK and SCK waveforms shown in FIGS. 10A and 10B. On the other hand, when the delays $t_{1max}$ and $t_{2max}$ are not equal, the relative values of $T_2$ and $T_4$ may be suitably adjusted to satisfy $t_{1max} < T_2$, $t_{2max} < T_4$ and $T_1+T_2+T_3+T_4 = T_{rated}$. $T_1$ and $T_3$ are the set-up times of the flip-flops 40 and 60, respectively.

Figure 13:
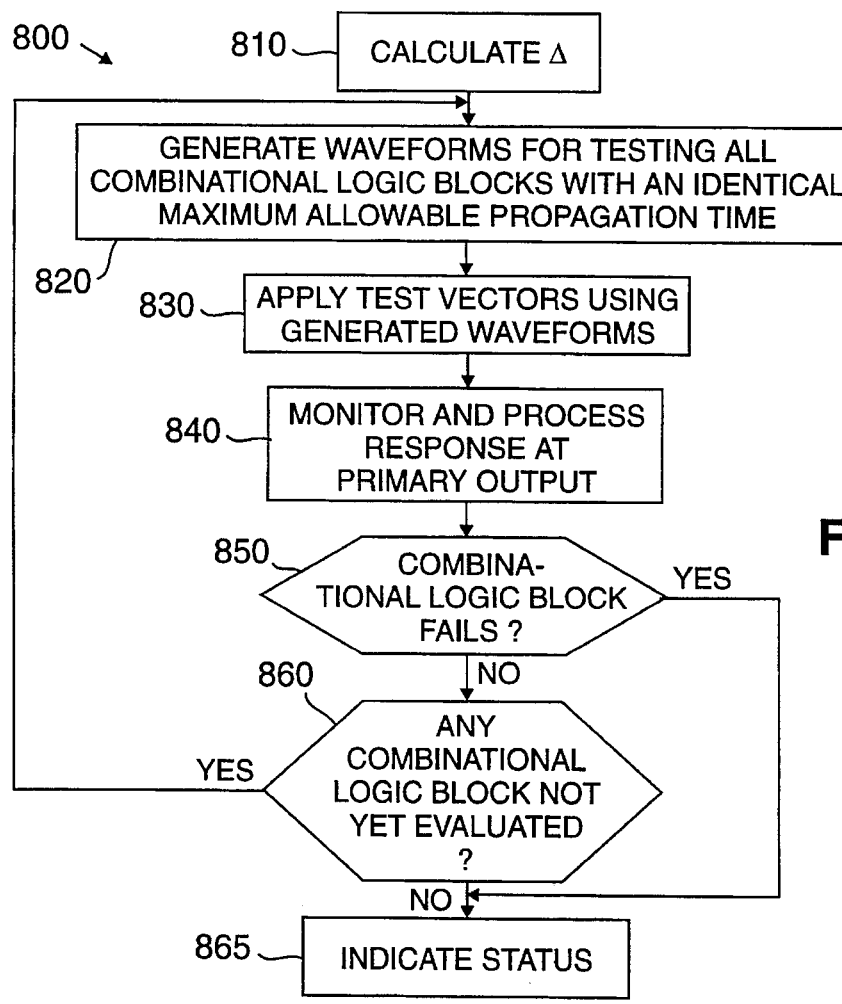
FIG. 13 is a flow diagram of a method for testing the combinational logic elements in the circuit of FIG. 12, according to the present invention.

According to the present invention, the ATE 15 may perform a process 800, as shown in FIG. 13, for testing the circuit 500 at slower than the rated clock rate. In step 810, the ATE 15 calculates $\Delta$ in the same manner as described above for the circuit 400. In step 820, the ATE 15 generates the appropriate clock waveforms for testing all combinational logic blocks in the circuit having an identical maximum allowable propagation time.

In step 830, the ATE 15 applies the test vectors and generated waveforms to the circuit 500, and then in step 840 records and compares the response at a primary output to the expected response. The steps 830 and 840 are performed by the ATE 15 in a similar manner as steps 630 and 640 of the process 600.

By way of example, the ATE 15 may supply the clock waveforms similar to MCK($\Delta$) and SCK($\Delta$) on the master and slave clock lines 330 and 340 of the circuit 500 to test the combinational logic block 580. As described above for the single combination logic block embodiment of the circuit 400, increasing the interval $T_2$ or $T_4$ by $\Delta$ in the waveforms MCK(TEST) and SCK(TEST) compensates for the longer propagation times through the combinational logic blocks 580 or 585, respectively, which would otherwise occur when test stimuli are applied at $f_{test}$. Therefore, the combinational logic block 580 may be tested at $f_{rated}$ by modifying the clock signal waveform SCK(TEST) with a small $\Delta$, such that $T_2+\Delta=t_{max}$. Further, it is noted that by modifying SCK(TEST) in this manner, $T_4$ becomes much larger than $t_{2max}$. Thus, only the logical operation of the combinational logic block 585 may be tested because the test signal is allowed to propagate through the combinational logic block 585 for more time than $f_{rated}$ would allow.

In step 850, the ATE 15 determines whether ATE testing of the circuit should proceed. If the recorded output response did not agree with the expected response for the combinational logic block under test, the circuit is rejected as faulty. The ATE 15, in this case, proceeds to step 865. In step 865, the ATE 15 indicates whether the circuit under test is faulty or operates properly.

On the other hand, if the circuit is not rejected in step 850, the ATE 15 proceeds to step 860. In step 860, the ATE 15 determines whether any combinational logic block in the circuit under test has not been evaluated pursuant to steps 820 through 850. If any combinational logic block has not been evaluated, the ATE 15 continues to perform the above sequence of steps 820 to 850 until all combinational logic blocks in the circuit are tested. The order in which the combinational logic blocks in a circuit are tested is unimportant.

After the ATE 15 in step 860 determines that all of the combinational logic blocks in the circuit have been evaluated, it would then proceed to step 865 and provide an indication of whether the circuit under test operates properly.

Continuing to apply the process 800 to the circuit 500, if the ATE 15 determines that the combinational logic block 580 operates properly during testing at $T_{test}$, the ATE 15 would then perform steps 820 through 850 to test the combinational logic block 585. The ATE 15 would generate clock waveforms similar to MCK($\Delta$) and SCK($\Delta$) for testing the combinational logic block 585 by reducing the interval $T_4$ in the waveforms MCK(TEST) and SCK(TEST) by adding a larger $\Delta$ to $T_2$, such that $T_4=t_{2max}$. The ATE 15 would then apply test stimuli to the master input 21 in accordance with these generated waveforms, and compare the recorded to the expected responses in the manner described above. For these modified MCK(TEST) and SCK(TEST) waveforms, the test signal must propagate through the combinational logic block 585 within the time allowed by $f_{rated}$, whereas the test signal is allowed more time to propagate through the combinational logic block 585, which has been previously tested.

It is to be understood that the inventive technique as illustrated in the above embodiments applies directly to all paths that begin at a flip-flop. These may be paths that end either at another flip-flop or at a primary output. For paths that begin at a primary input, similar delays may be added by an ATE by delaying the application of the input test vector following the clock edges at which the test vector would have been normally applied.

Figure 14:
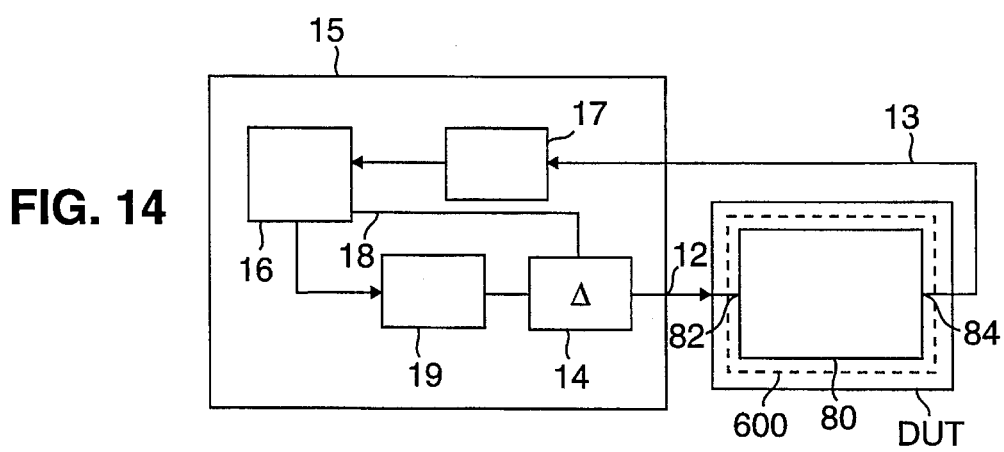
FIG. 14 illustrates an automatic test equipment configuration for testing a combinational logic block in a high speed digital circuit according to the present invention.

FIG. 14 shows an ATE 15 suitably connected to a DUT including a circuit 600 which is described below to illustrate the testing of a signal path that begins directly at a primary input and ends directly at a primary output.

The circuit 600 comprises a combinational logic block 80. The primary input of the DUT is directly connected to the input port 82 of the combinational logic block 80, and the primary output of the DUT is directly connected to the output port 84.

The ATE 15 comprises a processor 16 which is connected to an input flip-flop 19, a controllable delay circuit 14 and an output flip-flop 17. An input line 12 connects the delay circuit 14 to the input 82, and an output line 13 connects the output flip-flop 17 to the output 84. A control line 18 connects the delay circuit 14 to the processor 16.

The flip-flops 17 and 19 may comprise any well known latch element, and the delay circuit 14 is a conventional controllable delay circuit which may be used for introducing delay into a signal path according to the control signal that it is provided by the processor 16 over the line 18.

The ATE 15 may test a DUT including a circuit similar to the circuit 600 in the following manner. The processor 16 supplies control signals to flip-flops 17 and 19 for controlling propagation of a test stimuli through the circuit 600. The delay required for testing the circuit 80 at the test clock rate is controllably introduced to the test signal path by the processor 16 by the modification of the control signal which is applied to the delay circuit 14 over control line 18. According to the techniques described above, ATE testing of the circuit 600 may be performed at a test clock rate less than the rated frequency of the circuit 600 by suitably introducing a calculated delay to the test stimuli signal path, and comparing the recorded to the expected response.

It is to be understood that the embodiments and variations shown and described above are illustrative of the principles of this invention only and that various modifications may be implemented by those skilled in the art without departing from the scope and spirit of the invention.

We claim:

1. A method for testing the propagation delay of a combinational logic block in a combinational signal path of a high speed circuit utilizing a test clock rate less than the rated frequency of the circuit to test the ability of the circuit to operate properly at the rated frequency, comprising the steps of:

calculating a delay value, wherein the delay value is equal to the amount of delay that must be added to the combinational signal path during testing utilizing the test clock rate less than the rated frequency of the circuit, such that testing of the combinational logic block at the rated frequency is simulated in a manner that produces substantially the same signal values in the same sequence at all nodes in the circuit as would be produced in the normal high speed operation of the circuit;

applying a test stimulus to the signal path at the test clock rate;

adding the calculated delay to the signal path such that the test stimulus propagates through the combinational logic block of the circuit subject to the calculated delay;

recording the output response of the circuit; and, comparing the output response with an expected correct response.

2. The method of claim 1, wherein delay is added to the combinational signal path using a controllable delay element which is included in the combinational signal path.

3. A method for testing the propagation delay of a combinational logic block in a combinational signal path of a high speed circuit utilizing a test clock rate less than the rated frequency of the circuit to test the ability of the circuit to operate properly at the rated frequency, comprising the steps of:

calculating a delay value, wherein the delay value is equal to the amount of delay that must be added to the combinational signal path during testing utilizing the test clock rate less than the rated frequency of the circuit, such that testing of the combinational logic block at the rated frequency is simulated in a manner that produces substantially the same signal values in the same sequence at all nodes in the circuit as would be produced in the normal high speed operation of the circuit;

generating a clock signal for adding the calculated delay to the signal path, wherein the frequency of the clock signal is equal to the test clock rate;

applying a test stimuli in accordance with the clock signal to the circuit;

recording the output response of the circuit; and, comparing the output response with an expected correct response.

4. The method of claim 3, wherein delay is added to the combinational signal path using a controllable delay element which is included in the combinational signal path.

5. A method for testing the propagation delay of a combinational logic block in a single clock synchronous high speed digital circuit utilizing a test clock rate less than the rated frequency of the circuit to test the ability of the circuit to operate properly at the rated frequency, comprising the steps of:

calculating a delay value, wherein the delay value is equal to the amount of delay that must be added to the combinational signal path during testing utilizing the test clock rate less than the rated frequency of the circuit, such that testing of the combinational logic block at the rated frequency is simulated in a manner that produces substantially the same signal values in the same sequence at all nodes in the circuit as would be produced in the normal high speed operation of the circuit;

generating at least one clock signal for adding the calculated delay to the signal path, wherein the frequency of the at least one clock signal is equal to the test clock rate;

applying a test stimuli in accordance with the at least one clock signal to the circuit;

recording the output response of the circuit; and, comparing the output response with an expected correct response.

6. The method of claim 5, wherein a controllable delay element is included in the combinational signal path.

7. The method of claim 6, wherein the controllable delay element is connected in the combinational signal path between a two-latch element and the combinational logic block.

8. The method of claim 6, wherein the controllable delay is a static element.

9. The method of claim 6, wherein the controllable delay is a dynamic element.

10. The method of claim 7, wherein the step of generating the at least one clock signal further comprises the step of generating a first and second clock signal, wherein the first clock signal is used to control the clocking elements in the circuit, and wherein the second clock signal has characteristics that are a function of the calculated delay and is used to manipulate the controllable delay element so as to add delay to the combinational signal path of the circuit.

11. The method of claim 6, wherein the controllable delay element is included in the combinational signal path as an intermediate latch in a three-latch element.

12. The method of claim 11, wherein the step of generating the at least one clock signal further comprises the step of generating a first and second clock signal, wherein the first clock signal is used to test the timing operation of the combinational logic block and the logical operation of the controllable delay element, and wherein the second clock signal is used to test the timing operation of the controllable delay element and the logical operation of the combinational logic block.

13. A method for testing the propagation delay of a combinational logic block in a synchronous multiple clock high speed digital circuit utilizing a test clock rate less than the rated frequency of the circuit to test the ability of the circuit to operate properly at the rated frequency, comprising the steps of:

calculating a delay value, wherein the delay value is equal to the amount of delay that must be added to the combinational signal path during testing utilizing the test clock rate less than the rated frequency of the circuit, such that testing of the combinational logic block at the rated frequency is simulated in a manner that produces substantially the same signal values in the same sequence at all nodes in the circuit as would be produced in the normal high speed operation of the circuit;

generating a plurality of clock signals, wherein the frequency of each of the plurality of clock signals is equal to the test clock rate, and wherein one of the plurality of the clock signals differs from all the other clock signals by a function of the calculated delay;

applying a test stimulus in accordance with the plurality of clock signals to the circuit;

recording the output response of the circuit; and, comparing the output response with an expected response.

14. The method of claim 13, wherein the circuit is comprised of a plurality of combinational logic blocks, and wherein the step of generating a plurality of clock signals further comprises the step of varying each of the plurality of clock signals with respect to all other clock signals by a function of the calculated delay, such that each of the plurality of the combinational logic blocks may be tested using test stimuli which are applied at the test clock rate that is less than the rated frequency of the circuit.

15. An apparatus for testing the propagation delay of a combinational logic block in a combinational signal path of a synchronous high speed digital circuit utilizing a test clock rate less than the rated frequency of the circuit to test the ability of the circuit to operate properly at the rated frequency, comprising:

a means for generating a clock signal for adding a calculated delay to the signal path, wherein the frequency of the clock signal is equal to the test clock rate and the delay value is equal to the amount of delay that must be added to the combinational signal path during testing utilizing the test clock rate less than the rated frequency of the circuit, such that testing of the combinational logic block at the rated frequency is simulated in a manner that produces substantially the same signal values in the same sequence at all nodes in the circuit as would be produced in the normal high speed operation of the circuit;

a means for applying a test stimuli in accordance with the clock signal to the circuit;

a means for recording the output response of the circuit; and, a means for comparing the output response with an expected correct response.

16. The apparatus of claim 15, wherein the apparatus further comprises a means for calculating the delay value.

17. The apparatus of claim 14, wherein the means for generating the clock signal further comprises a means for modifying the generated signal using the calculated delay value in order to manipulate a controllable delay element which is included in the combinational signal path.

18. An apparatus for testing the propagation delay of a combinational logic block in a combinational signal path of a synchronous high speed digital circuit utilizing a test clock rate less than the rated frequency of the circuit to test the ability of the circuit to operate properly at the rated frequency, comprising:

a processor for generating a clock signal for adding a calculated delay to the signal path, wherein the frequency of the clock signal is equal to the test clock rate and the delay value is equal to the amount of delay that must be added to the combinational signal path during testing utilizing the test clock rate less than the rated frequency of the circuit, such that testing of the combinational logic block at the rated frequency is simulated in a manner that produces substantially the same signal values in the same sequence at all nodes in the circuit as would be produced in the normal high speed operation of the circuit;

wherein the processor applies test stimuli in accordance with the clock signal to the circuit, wherein the processor records the output response of the circuit, and, wherein the processor compares the output response with an expected correct response.

19. The apparatus of claim 18, further comprising a delay circuit for adding the calculated delay value to the signal path.

20. The apparatus of claim 18, further comprising a flip-flop for controlling the propagation of the test stimuli to the combinational logic block.

21. The apparatus of claim 19, further comprising a flip-flop for controlling the propagation of test stimuli to the combinational logic block.

22. The apparatus of claim 18, further comprising a flip-flop for receiving the test stimuli applied which is applied to the combinational logic block under test.

23. The apparatus of claim 19, further comprising a flip-flop for receiving the propagation of the test stimuli applied to the combinational logic block.

* * * * *